(12) United States Patent
Hsieh et al.

(10) Patent No.: US 11,127,784 B2
(45) Date of Patent: Sep. 21, 2021

(54) INTEGRATED CIRCUITS WITH EMBEDDED MEMORY STRUCTURES AND METHODS FOR FABRICATING THE SAME

(71) Applicant: Globalfoundries Singapore Pte. Ltd., Singapore (SG)

(72) Inventors: Curtis Chun-I Hsieh, Singapore (SG); Wanbing Yi, Singapore (SG); Yi Jiang, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 15 days.

(21) Appl. No.: 16/218,311

(22) Filed: Dec. 12, 2018

(65) Prior Publication Data

US 2020/0194496 A1 Jun. 18, 2020

(51) Int. Cl.
*H01L 43/12* (2006.01)
*H01L 27/22* (2006.01)
*G11C 11/16* (2006.01)
*H01L 43/02* (2006.01)
*H01L 43/10* (2006.01)
*H01L 43/08* (2006.01)

(52) U.S. Cl.
CPC .......... *H01L 27/222* (2013.01); *G11C 11/161* (2013.01); *H01L 43/02* (2013.01); *H01L 43/08* (2013.01); *H01L 43/10* (2013.01); *H01L 43/12* (2013.01)

(58) Field of Classification Search
CPC ......... H01L 43/08; H01L 43/10; H01L 43/12; H01L 27/222; H01L 27/228; H01L 43/02; G11C 2211/5615; G11C 11/161; H01F 10/329; H01F 10/3286–3295
See application file for complete search history.

(56) References Cited

U.S. PATENT DOCUMENTS 9,349,772 B2 5/2016 Yi et al.
2020/0066580 A1* 2/2020 Peng ...................... H01L 45/16

* cited by examiner

Primary Examiner — Suberr L Chi
(74) Attorney, Agent, or Firm — Thompson Hine LLP

(57) ABSTRACT

Integrated circuits with embedded memory structures, and methods for fabricating integrated circuits are provided. An exemplary method for fabricating an integrated circuit includes forming from a first metallization layer a first lower conductive interconnect in a first region of a dielectric layer and a second lower conductive interconnect in a second region of the dielectric layer. The method includes forming a memory structure in the first region. Further, the method includes depositing an interlayer dielectric over the first region and over the second region. Also, the method includes forming from a second metallization layer a first upper conductive interconnect over the interlayer dielectric, wherein the first upper conductive interconnect is coupled to the memory structure.

12 Claims, 2 Drawing Sheets

INTEGRATED CIRCUITS WITH EMBEDDED MEMORY STRUCTURES AND METHODS FOR FABRICATING THE SAME

TECHNICAL FIELD

The technical field generally relates to sophisticated semiconductor devices and the manufacturing of such devices, and, more specifically, to integrated circuits with memory structures embedded in metallization layers.

BACKGROUND

As the density of memory devices in integrated circuits increases, integration of such devices in back end of line (BEOL) processing becomes difficult. For example, placement of memory devices within the metallization layers is challenging.

For magnetoresistive random access memory (MRAM) technology, memory structures such as magnetic tunnel junction (MTJ) stacks may require greater heights than those of the metallization vertical interconnect access (vias) in existing processing. As a result, simple substitution of MTJ stacks at the locations of metallization vias is impractical. Therefore, more complicated arrangements may be utilized to form MTJ stacks during BEOL processing.

Accordingly, it is desirable to provide improved integrated circuits with embedded memory structures, and improved methods for fabricating such structures. It is further desirable to provide a memory structure with improved performance. It is also desirable to provide methods for fabricating integrated circuits with high density memory structures that are less expensive and less time consuming than current methods. Furthermore, other desirable features and characteristics will become apparent from the subsequent detailed description and the appended claims, taken in conjunction with the accompanying drawings and this background.

BRIEF SUMMARY

Integrated circuits with embedded memory structures, and methods for fabricating integrated circuits are provided. An exemplary method for fabricating an integrated circuit includes forming from a first metallization layer a first lower conductive interconnect in a first region of a dielectric layer and a second lower conductive interconnect in a second region of the dielectric layer. The method includes forming a memory structure in the first region. Further, the method includes depositing an interlayer dielectric over the first region and over the second region. Also, the method includes forming from a second metallization layer a first upper conductive interconnect over the interlayer dielectric, wherein the first upper conductive interconnect is coupled to the memory structure.

In another embodiment, a method for fabricating an integrated circuit includes forming a lower conductive interconnect in a dielectric layer; depositing a bottom electrode layer over the lower conductive interconnect and the dielectric layer; depositing magnetic tunnel junction (MTJ) layers over the bottom electrode layer; depositing a top electrode layer over the MTJ layers; and etching the top electrode layer, the MTJ layers, the bottom electrode layer, and an upper portion of the dielectric layer to form an MTJ structure, a dielectric pillar, and a trench, wherein the dielectric pillar is surrounded by the trench, and wherein the MTJ structures is disposed directly over the dielectric pillar.

In another embodiment, an integrated circuit is provided and includes a first lower conductive interconnect and second lower conductive interconnect formed a common first metallization layer. Further, the integrated circuit includes a bottom electrode in direct physical contact with the first lower conductive interconnect, a magnetic tunnel junction (MTJ) structure over and in direct physical contact with the bottom electrode, and a top electrode in direct physical contact with the MTJ structure. The integrated circuit also includes a conductive via in direct physical contact with the second lower conductive interconnect. The integrated circuit further includes a first upper conductive interconnect and second upper conductive interconnect formed a common second metallization layer, wherein the first upper conductive interconnect is in direct physical contact with the top electrode, and wherein the second upper conductive interconnect is in direct physical contact with the conductive via.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
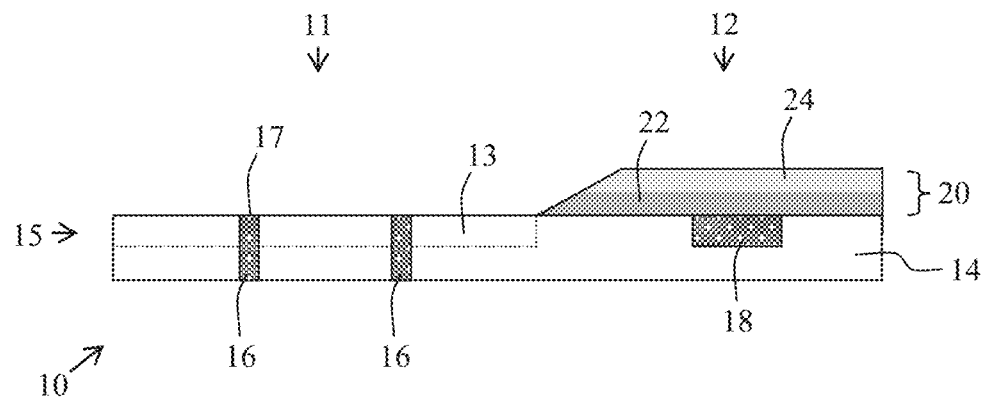
FIGS. 1-5 are cross sectional schematic views of integrated circuit fabrication processing for forming an integrated circuit with a memory structure embedded between two adjacent metallization layers in accordance with embodiments herein.

The following detailed description is merely exemplary in nature and is not intended to limit the integrated circuits with embedded memory structures and methods for fabricating such integrated circuits. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various processes in the fabrication memory devices are well-known and so, in the interest of brevity, many conventional processes will only be mentioned briefly herein or will be omitted entirely without providing the well-known process details. Further, it is noted that integrated circuits with memory structure, include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "uppermost", "over", "under", "lower", "lowest" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

Further, as used herein, a layer identified as a "material layer" or as being a "material" includes at least 50 wt. % of the recited material. As used herein, a layer identified as a "primarily material layer" or as being "primarily material" is a layer that includes at least 90 wt. % of the recited material.

As will be readily apparent to those skilled in the art upon a complete reading of the disclosure, the devices disclosed herein may be employed with a variety of technologies, and may be incorporated into a variety of integrated circuit products. With reference to the attached drawings, various illustrative embodiments of the methods and devices disclosed herein will now be described in more detail. It should be understood that the various features and layers in the attached drawings may not be to scale.

Embodiments herein are directed towards memory structures, for example magnetoresistive random access memory (MRAM) structures or resistive random access memory (RRAM) structures, arrays of such structures, and various methods of fabricating such structures or arrays. As described herein, an exemplary memory structure is embedded between directly adjacent metallization layers, i.e., a first and a second metallization layer, such that the memory structure does not pass through a plane defined by an unused intermediate metallization layer between the first and second metallization layers. In other words, an exemplary integrated circuit contacts a bottom electrode of an MTJ structure directly to a lower metallization layer ($M_x$), and contacts a top electrode of the MTJ structure directly to the next highest metallization layer ($M_{x+1}$). This structure is unlike conventional processing wherein a memory structure contacted to a lower metallization layer ($M_x$) by a conductive via is at too great a height to be contacted to the next immediately higher metallization layer ($M_{x+1}$).

FIGS. 1-5 depict an embodiment of a method for fabricating an integrated circuit device 10, including a non-volatile memory structure. Specifically, the illustrated method may be used to fabricate a memory structure. More particularly, the illustrated method is useful for fabricating a memory embedded in metallization layers in an integrated circuit. In FIG. 1, a partially fabricated integrated circuit device 10 is illustrated and is formed in or on or includes a dielectric layer 14. The dielectric layer 14 may be an interlayer dielectric (ILD) formed over an underlying substrate (not shown). An exemplary substrate is a semiconductor substrate. As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an exemplary embodiment, the semiconductor material is a silicon substrate, such as crystalline silicon. The silicon substrate may be a bulk silicon wafer or may be a thin layer of silicon on an insulating layer (in a structure commonly known as semiconductor-on-insulator or SOI) that, in turn, is supported by a carrier wafer. The insulating layer, for example, may be formed of a dielectric insulating material. An exemplary insulating layer is from silicon oxide, which provides a buried oxide (BOX) layer. Other types of dielectric insulating materials may also be useful. The SOI substrate, for example, may be a fully depleted silicon-on-insulator (FDSOI) substrate. For example, the thin surface and bulk layers may be single crystalline silicon. Other types of SOI substrates may also be useful. It is understood that the surface and bulk layers need not be formed of the same material.

While not illustrated, semiconductor devices, such as metal oxide field effect transistors (MOSFETs), capacitors, resistors, and the like may be formed over or in the semiconductor substrate below the dielectric layer 14 according to conventional integrated circuit processing. The devices formed during a series of processes that form individual integrated circuit components, e.g., transistors, capacitors, resistors, etc., over substrate may be interconnected into a circuit by means of one or more metal interconnecting layers, i.e., metallization layers.

In an exemplary embodiment, various metal and dielectric layer deposition and etching processes may be performed according to conventional integrated circuit processing to form the dielectric layer 14 with an embedded metallization layer 15 in selective contact with underlying devices. As shown, first lower conductive interconnects 16 are formed from the metallization layer 15 in a first region 11 of the integrated circuit device 10 and second lower conductive interconnects 18 (only one second lower conductive interconnect is illustrated) are formed from the metallization layer 15 in a second region 12 of the integrated circuit device 10. As a result, the first lower conductive interconnects 16 and the second lower conductive interconnects 18 are formed with a common coplanar uppermost surface 17, i.e., the uppermost surface of the first metallization layer 15.

In an exemplary embodiment, the metallization layer 15 is formed utilizing a damascene process. Further, an exemplary metallization layer 15 is copper, though other suitable conductive materials may be used.

In FIG. 1, the method for fabricating an integrated circuit 10 is shown to include the formation of a blocking layer 20 in the second region 12 to block or prevent contact between the second lower conductive interconnect 18 and later deposited interlayer dielectric and/or to serve as an etch stop layer (ESL) during later processing. An exemplary blocking layer 20 is an insulating or dielectric material, such as nitrogen doped carbide (NDC), nitrogen-doped silicon carbide diffusion layer, aluminum nitrogen oxide, or any advanced etch stop layers. The blocking layer 20 may be formed as a stack of at least two different sublayers 22 and 24. The blocking layer 20 may be deposited using chemical vapor deposition (CVD) or plasma enhanced CVD (PECVD) processes. The method may include polishing the blocking layer 20 using a chemical mechanical planarization/polish (CMP) process.

In an exemplary embodiment, lower sublayer 22 is a passivation layer 22, which is formed on the second lower conductive interconnect 18. An exemplary upper sublayer 24 is an insulator layer 24 formed on the passivation layer 22. In one example, silicon carbide with nitrogen deposited using chemical vapor deposition (CVD) from a trimethylsilane source, which is commercially available from Applied Materials under the tradename of BLOK®, is used as the passivation layer 22. The compound with less nitrogen (N) (less than about 5 mol %), i.e., SiaCbNcHd, is referred to as "BLoK", and the compound with more N (about 10 mol % to about 25 mol %), i.e., SiwCxNyHz, is referred to as "NBLoK". BLoK has a lower dielectric constant of less than 4.0, whereas NBLoK has a dielectric constant of about 5.0. While BLoK is not a good oxygen barrier but is a good copper (Cu) barrier, NBLoK is both a good oxygen barrier and a good Cu barrier. In an exemplary embodiment, the passivation layer 22 is or includes NBLoK material. In one example, the insulator layer 24 is formed from silicon oxide. Specifically, the insulator layer 24 may be formed from tetraethyl orthosilicate (TEOS). Formation of the blocking layer 20 may include conventional deposition and lithography processing including masking and etching to remove the passivation layer 22 and insulator layer 24 from the first region 11 and to define the blocking layer 20 in the second region 12 as shown.

After formation of the blocking layer 20, the first region 11 may be cleaned such as by a soft pad touch up process. As shown in FIG. 1, in the first region 11, the dielectric layer 14 includes an upper portion 13 that may be etched during processing as described below in relation to FIG. 3.

Figure 2:
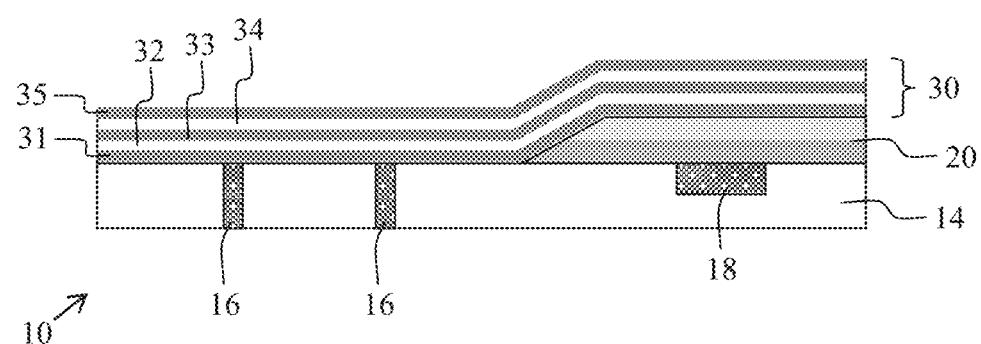

Referring now to FIG. 2, the integrated circuit device 10 is illustrated after performing several deposition processes. Specifically, memory structure layers 30 are successively blanket deposited over the first and second regions 11 and 12. The memory structure layers 30 include a bottom electrode layer 31, magnetic tunnel junction (MTJ) layers 32, 33 and 34, and a top electrode layer 35.

Though not necessary, in certain embodiments the bottom electrode layer 31 and top electrode layer 35 are formed from a same metal material. An exemplary bottom electrode layer 31 is a conductive material, such as a metal, including metal alloys. In an exemplary embodiment, bottom electrode layer 31 is tantalum, tantalum nitride, titanium, tungsten, and/or other commonly used conductive metals. In an exemplary embodiment, the bottom electrode layer 31 is formed by depositing the conductive material by a CVD process. An exemplary top electrode layer 35 is a conductive material, such as a metal or a metal alloy. In an exemplary embodiment, top electrode layer 35 is tantalum, tantalum nitride, titanium, tungsten, and/or other commonly used conductive metals. In an exemplary embodiment, the top electrode layer 35 is formed by depositing the conductive material by a CVD process.

While three exemplary MTJ layers 32, 33, and 34 are illustrated, any number of desired and suitable MTJ layers may be utilized. Exemplary MTJ layers 32, 33 and 34 may include a magnetically fixed layer or polarizer layer, a tunnel barrier layer or layers, a magnetically free layer or storage layer, seed layers, wetting layers, spacer layers, anti-ferromagnetic layers, and the like. It is realized that MTJ layers of many variations may be provided that are within the scope of the present disclosure. The MTJ layers 32, 33 and 34 may be deposited using physical vapor deposition (PVD), CVD and/or ALD techniques.

Figure 3:
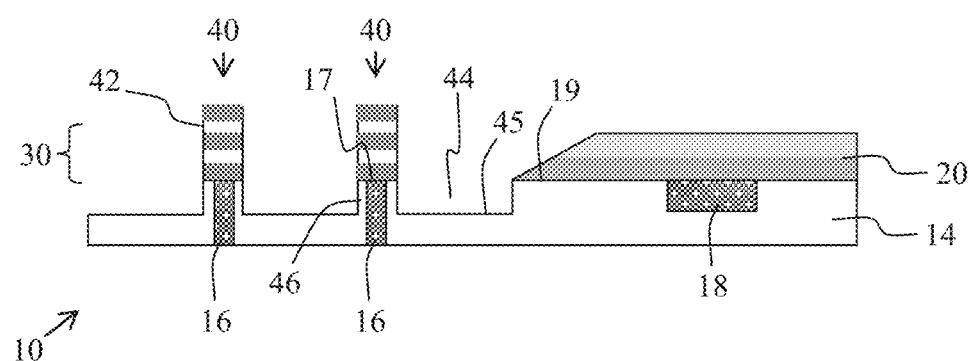

In FIG. 3, the method may continue with etching the memory structure layers 30 to form stacked memory structures 40 in the first region 11 directly over the first lower conductive interconnects 16. As shown, the exemplary memory structures 40 are formed with substantially vertical sidewalls 42. As a result of the etch process, the memory structure layers 30 are removed from the second region 12. The blocking layer 20 may prevent etching of the dielectric layer 14 in the second region 12. The etch process may be performed with conventional lithography techniques including mask formation and patterning and anisotropic etching.

It is noted that the etch process includes removal of the upper portion 13 (shown in FIG. 1) of the dielectric layer 14 that does not lie directly below the memory structures 40. As a result, trenches 44 are formed around the memory structures 40. The trenches 44 extend downward to a trench bottom surface 45, i.e., a lowest surface. In exemplary embodiments, the etch process removes from about 50 to about 150 nanometers (nm) of the dielectric layer 14 such that the trench bottom surface 45 is from about 50 to about 150 nm below an uppermost surface 19 of the remaining unetched portions of the dielectric layer 14 or from about 50 to about 150 nm below the uppermost surface 17 of the conductive interconnects 16 and 18.

As shown, barrier regions 46 of the upper portion 13 of the dielectric layer 14 that lie directly under the memory structures 40 remain unetched and separate the first lower conductive interconnects 16 from the trenches 44. The barrier regions 46 form dielectric pillars on which the memory structures 40 are disposed.

Figure 4:
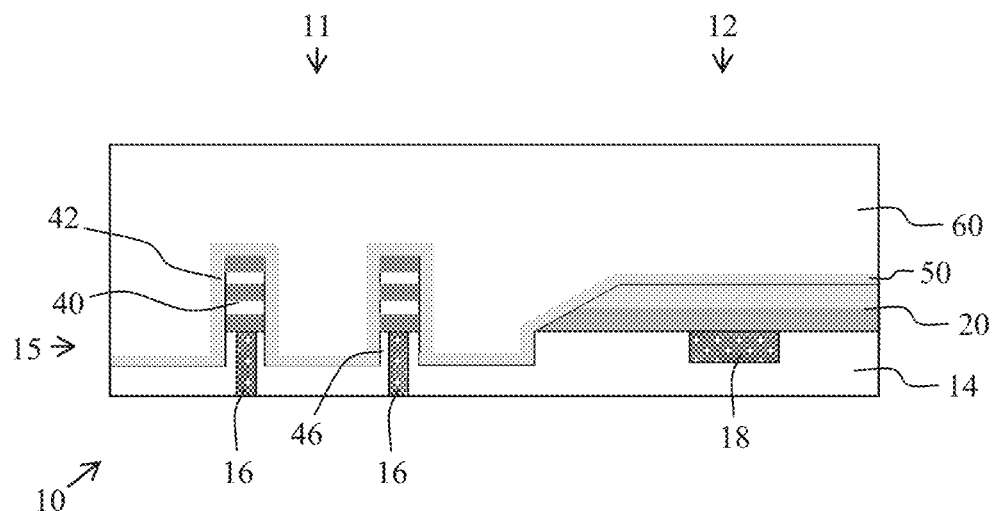

Referring now to FIG. 4, further processing is illustrated and includes the deposition of an encapsulation layer 50 and an interlayer dielectric 60. As shown, the encapsulation layer 50 may be blanket deposited over the first and second regions 11 and 12 and over the memory structures 40, including on the sidewalls 42 of the memory structures 40 and on the barrier regions 46. The encapsulation layer 50 may be a non-oxidizing material, such as a dielectric material. The encapsulation layer 50 may prevent oxidation of the layers of the memory structures 40. In an exemplary embodiment, the encapsulation layer 50 is silicon nitride, though other suitable materials may be used. In an exemplary embodiment, encapsulation layer 50 is deposited by an ALD process.

After formation of the encapsulation layer 50, the interlayer dielectric 60 is formed over the first and second regions 11 and 12. The interlayer dielectric 60 may include several distinct layers. In an exemplary embodiment, the interlayer dielectric 60 is silicon oxide. In an exemplary embodiment, the interlayer dielectric 60 is deposited by a flowable CVD process. As a result, the interlayer dielectric 60 may fill gaps between adjacent memory structures 40 formed in array of memory structures 40. The method may further include annealing the interlayer dielectric 60 and planarizing the interlayer dielectric 60.

Figure 5:
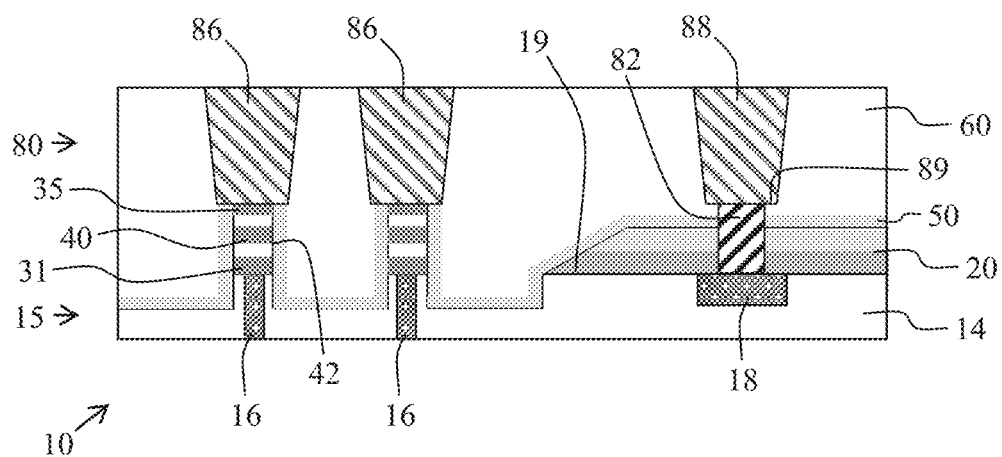

The method may continue in FIG. 5 with the formation of a conductive via 82 and formation of first upper conductive contacts 86 and second upper conductive contact 88 from a second metallization layer 80. Such processing may be performed according to conventional lithography and deposition processes. For example, a multiple step etch process may be performed in accordance with conventional processing and formation and opening of hardmasks (not shown) and additional underlying layers (not shown). In such an embodiment, a first etch may be performed through an upper mask before a second etch is performed through a lower mask. The etch processes form trenches where the upper conductive interconnects 86 and 88 are disposed and form a via hole where the conductive via 82 is disposed. As shown, the trenches may land at a trench bottom 89 at a same height over upper surface 19 for the upper conductive interconnects 86 and 88.

As shown, the etch process includes etching the interlayer dielectric 60 over the memory structures 40 and removing the encapsulation layer 50 from over the memory structures 40. During the metallization process, i.e., the deposition of the second metallization layer 80, a conductive material such as a metal is deposited over the interlayer dielectric 60, into the etched trenches and into direct contact with the memory structures 40 to form the first upper conductive interconnects 86. Thus, after formation, the first upper conductive interconnects 86 are in direct physical contact with the top electrode of the respective memory structures 40.

Likewise, the conductive via 82 may be formed by patterning a via hole into a lower portion of the interlayer dielectric 60 and through the blocking layer 20 before filling the via hole with a conductive material, such as from the metallization layer 80. In an exemplary embodiment, the metallization process fills the via hole and the trench overlying the via hole to form the conductive via 82 and second upper conductive interconnect 88 from the second metallization layer 80.

In an exemplary embodiment, metallization layer 80 is formed from the same metal as the first metallization layer 15. For example, the metal may be copper. In an exemplary embodiment, the metallization layer 80 is formed by metal deposited by a sputtering process, an electroplating process, an electroless process or other suitable process. In FIG. 5, the method may include a planarization process to remove an overburden portion of the metallization layer 80.

As a result of the processing described in FIGS. 1-5, the memory structures 40 are formed between adjacent metallization layers 15 and 80, with bottom electrode layer 31 in direct physical contact with metallization layer 15, i.e., with no intervening conductive via therebetween, and with top electrode layer 35 in direct physical contact with metallization layer 80, i.e., with no intervening conductive via therebetween.

The described processing may provide for formation of memory structures 40 between adjacent metallization layers at technology nodes with increased scaling. For example, by eliminating the conductive via from the lower metallization layer to the memory structure, the memory structure is provided with sufficient vertical space to include a bottom electrode having a thickness (vertical) of about 10 nm, a stack of MTJ layers with a total thickness of about 40 nm, and a top electrode having a thickness of about 30 nm.

As described herein, an exemplary integrated circuit is provided with a memory structure, such as an MRAM structure like an MTJ stack, embedded between metallization layers. The exemplary memory structure is formed in direct physical contact with the underlying and overlying metallization layers. The metallization layers are vertically adjacent to one another such that no other metallization layers are disposed therebetween, whether in the first region or elsewhere on the semiconductor chip. The methods described herein provide for the integration of logic and memory structures seamlessly. Also, while often described in the context of MRAM, the method employed herein may be used in RRAM technology. Further, the processes described herein are similar to processes in conventional CMOS processing such that necessary process equipment and actions are available.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method for fabricating an integrated circuit, the method comprising:

forming a first lower conductive interconnect in a first dielectric layer within a first integrated circuit region and a second lower conductive interconnect in the first dielectric layer within a second integrated circuit region;

forming a dielectric blocking layer over the first dielectric layer within the first integrated circuit region and within the second integrated circuit region;

removing the dielectric blocking layer from the first integrated circuit region to reveal the first lower conductive interconnect;

depositing a bottom electrode layer on the first dielectric layer within the first integrated circuit region and on the dielectric blocking layer within the second integrated circuit region, wherein the bottom electrode layer is in contact with the first lower conductive interconnect;

depositing a plurality of magnetic tunnel junction (MTJ) layers over the bottom electrode layer;

depositing a top electrode layer over the MTJ layers;

forming a stacked memory structure directly over the first lower conductive interconnect by etching the top electrode layer, the MTJ layers, and the bottom electrode layer with an etch process; and etching an upper portion of the first dielectric layer adjacent to the stacked memory structure with the etch process to form a trench in the first dielectric layer that surrounds the first lower conductive interconnect and residual regions of the first dielectric layer beneath the stacked memory structure, wherein the dielectric blocking layer prevents etching by the etch process of the first dielectric layer within the second integrated circuit region.

2. The method of claim 1 wherein the first dielectric layer within the second integrated circuit region has an uppermost surface, and the trench has a bottom surface from about 50 nm to about 150 nm below the uppermost surface of the first dielectric layer.

3. The method of claim 1 wherein the second lower conductive interconnect has an uppermost surface, and the trench has a bottom surface from about 50 nm to about 150 nm below the uppermost surface of the second lower conductive interconnect.

4. The method of claim 1 wherein the stacked memory structure includes a top electrode formed by etching the top electrode layer, and further comprising:

forming an upper conductive interconnect that is in direct physical contact with the top electrode of the stacked memory structure.

5. The method of claim 1 wherein the stacked memory structure includes a top electrode formed by etching the top electrode layer, and further comprising:

forming an upper conductive interconnect that is in direct physical contact with the top electrode of the stacked memory structure with no intervening conductive via between the top electrode and the upper conductive interconnect.

6. The method of claim 1 wherein the etch process removes the top electrode layer, the MTJ layers, and the bottom electrode layer from the dielectric blocking layer within the second integrated circuit region.

7. The method of claim 1 further comprising:
forming a via hole in the dielectric blocking layer over the first dielectric layer within the second integrated circuit region; and
forming a conductive via in the via hole.

8. The method of claim 7 further comprising:
forming a first upper conductive interconnect that is in direct physical contact with the stacked memory structure; and
forming a second upper conductive interconnect over the conductive via.

9. The method of claim 8 wherein the first upper conductive interconnect is formed in a first trench in a second dielectric layer, the second upper conductive interconnect is formed in a second trench in the second dielectric layer, and the first trench and the second trench have respective trench bottoms at a same height over an uppermost surface of the first dielectric layer within the second integrated circuit region.

10. The method of claim 1 wherein the stacked memory structure is in direct physical contact with the first lower conductive interconnect.

11. The method of claim 4 wherein the stacked memory structure is in direct physical contact with the first lower conductive interconnect.

12. The method of claim 5 wherein the stacked memory structure is in direct physical contact with the first lower conductive interconnect.

* * * * *